United States Patent
Bone (10) Patent No.: US 6,647,309 B1
(45) Date of Patent: Nov. 11, 2003

(54) METHOD AND APPARATUS FOR AUTOMATED GENERATION OF TEST SEMICONDUCTOR WAFERS

(75) Inventor: Christopher A. Bone, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/577,403

(22) Filed: May 22, 2000

(51) Int. Cl.[7] .............................................. G06F 19/00
(52) U.S. Cl. ...................................... 700/121; 700/110
(58) Field of Search ................................. 700/119, 120, 700/121, 108, 109, 110; 438/5, 7, 10, 11, 16, 17, 50

(56) References Cited

U.S. PATENT DOCUMENTS

| | | | | |
|---|---|---|---|---|
| 5,655,110 A | * | 8/1997 | Krivokapic et al. | 716/19 |
| 6,166,801 A | * | 12/2000 | Dishon et al. | 355/27 |
| 6,171,737 B1 | * | 1/2001 | Phan et al. | 430/30 |
| 6,177,133 B1 | * | 1/2001 | Gurer et al. | 427/240 |
| 6,192,287 B1 | * | 2/2001 | Solomon et al. | 700/110 |
| 6,255,125 B1 | * | 7/2001 | Schmidt et al. | 438/14 |
| 6,303,395 B1 | * | 10/2001 | Nulman | 438/14 |

* cited by examiner

Primary Examiner—Leo Picard
Assistant Examiner—Chad Rapp
(74) Attorney, Agent, or Firm—Williams, Morgan & Amerson, P.C.

(57) ABSTRACT

The present invention provides for a method and an apparatus for automated generation of test semiconductor wafers. At least one process run of semiconductor devices is performed. A determination is made whether an excursion of the process exists. An automated test wafer generation process is performed in response to the determination that an excursion of the process exists. A control parameter modification sequence is implemented in response to an examination of the test wafers.

25 Claims, 8 Drawing Sheets

METHOD AND APPARATUS FOR AUTOMATED GENERATION OF TEST SEMICONDUCTOR WAFERS

BACKGROUND OF THE INVENTION

1. Field of the Invention

This invention relates generally to manufacturing of semiconductor products, and, more particularly, to a method and apparatus for automatically generating test semiconductor wafers based upon process performance in run-to-run control of semiconductor manufacturing.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are rapid thermal anneal (RTA) control, chemical mechanical polishing (CMP) control, etching, and overlay control. Overlay is one of several important steps in the photolithography area of semiconductor manufacturing. Overlay process involves measuring the misalignment between two successive patterned layers on the surface of a semiconductor device. Generally, minimization of misalignment errors is important to ensure that the multiple layers of the semiconductor devices are connected and functional.

Generally, process engineers currently analyze the process errors a few times a month. The results from the analysis of the process errors are used to make updates to process tool settings manually. Generally, a manufacturing model is employed to control the manufacturing processes. Some of the problems associated with the current methods include the fact that the process tool settings are only updated a few times a month. Furthermore, currently, the process tool updates are generally performed manually. Many times, errors in semiconductor manufacturing are not organized and reported to quality control personnel. Often, the manufacturing models themselves incur bias errors that could compromise manufacturing quality.

Generally, a set of processing steps is performed on a lot of wafers on a semiconductor manufacturing tool called an exposure tool or a stepper, followed by processing of the semiconductor wafers in etch tools. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework.

The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Many times, errors can occur during the processing of semiconductor devices.

There are many environmental factors that can affect the quality and efficiency of processed semiconductor wafers. These environmental factors include barometric pressure during process operation, certain gases present during process operation, temperature conditions, and relative humidity during process operation. Effects of the aforementioned environmental factors can lead to misprocessing of semiconductor wafers during manufacturing processes. One major effect of environmental factors in semiconductor manufacturing processes is the errors that occur in the critical dimensions of the processed semiconductor wafer. Errors in the critical dimensions of a semiconductor wafer can cause severe performance problems. Furthermore, to improve production efficiency, a manufacturing lot of semiconductor wafers are often processed without 100% of the processed semiconductor wafers being metrology tested. This can improve the probability that sub-standard semiconductor wafers are processed without adequate feedback correction.

The present invention is directed to overcoming, or at least reducing the effects of, one or more of the problems set forth above.

SUMMARY OF THE INVENTION

In one aspect of the present invention, a method is provided for automated generation of test semiconductor wafers. At least one process run of semiconductor devices is performed. A determination is made whether an excursion of the process exists. An automated test wafer generation process is performed in response to the determination that an excursion of the process exists. A control parameter modification sequence is implemented in response to an examination of the test wafers.

In another aspect of the present invention, an apparatus is provided for automated generation of test semiconductor wafers. The apparatus of the present invention comprises: a computer system; a manufacturing model coupled with the computer system, the manufacturing model being capable of generating at least one control input parameter signal; a machine interface coupled with the manufacturing model, the machine interface being capable of receiving process recipes from the manufacturing model; a processing tool capable of processing semiconductor wafers and coupled with the machine interface, the first processing tool being capable of receiving at least one control input parameter signal from the machine interface; a metrology tool coupled with the first processing tool and the second processing tool, the metrology tool being capable of acquiring metrology data; a metrology data processing unit coupled with the metrology tool and the computer system, the metrology data processing unit being capable of organizing the acquired metrology data and sending the organized metrology data to the computer system; an environmental sensor coupled to the processing tool, the environmental sensor being capable of acquiring environmental data during an operation of the processing tool; an environmental data analysis unit coupled with the environmental sensor, the environmental data analysis unit being capable of organizing the environmental data and correlating the environmental data with the metrology data; and a test wafer unit coupled with the computer system, the test wafer unit being capable of acquiring test wafers in response to the environmental data analysis.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. As semiconductor devices are processed through manufacturing tools, production data, or manufacturing data, is generated. The production data can be used to perform fault detection analysis that can lead to improved manufacturing results. Overlay and etching processes are important groups of process steps in semiconductor manufacturing. In particular, metrology data, including manufacturing data, is acquired after manufacturing processes such as photolithography and photoresist etching processes are substantially completed. The metrology data can be used to make adjustments to manufacturing processes for subsequent manufacturing runs of semiconductor devices, such as semiconductor wafers. Environmental factors can affect the quality and performance of the semiconductor wafers. Environmental factors include barometric pressure during process operation, certain gases present during process operation, temperature conditions, and relative humidity during process operation. Many times, in order to promote efficiency, metrology data acquisition is not performed on every semiconductor wafer that is processed. A lack of metrology data can cause a manufacturing process to stray from acceptable tolerances. The present invention provides a method and an apparatus for automatically generating test semiconductor wafers to reduce errors during semiconductor manufacturing processes.

Figure 1:
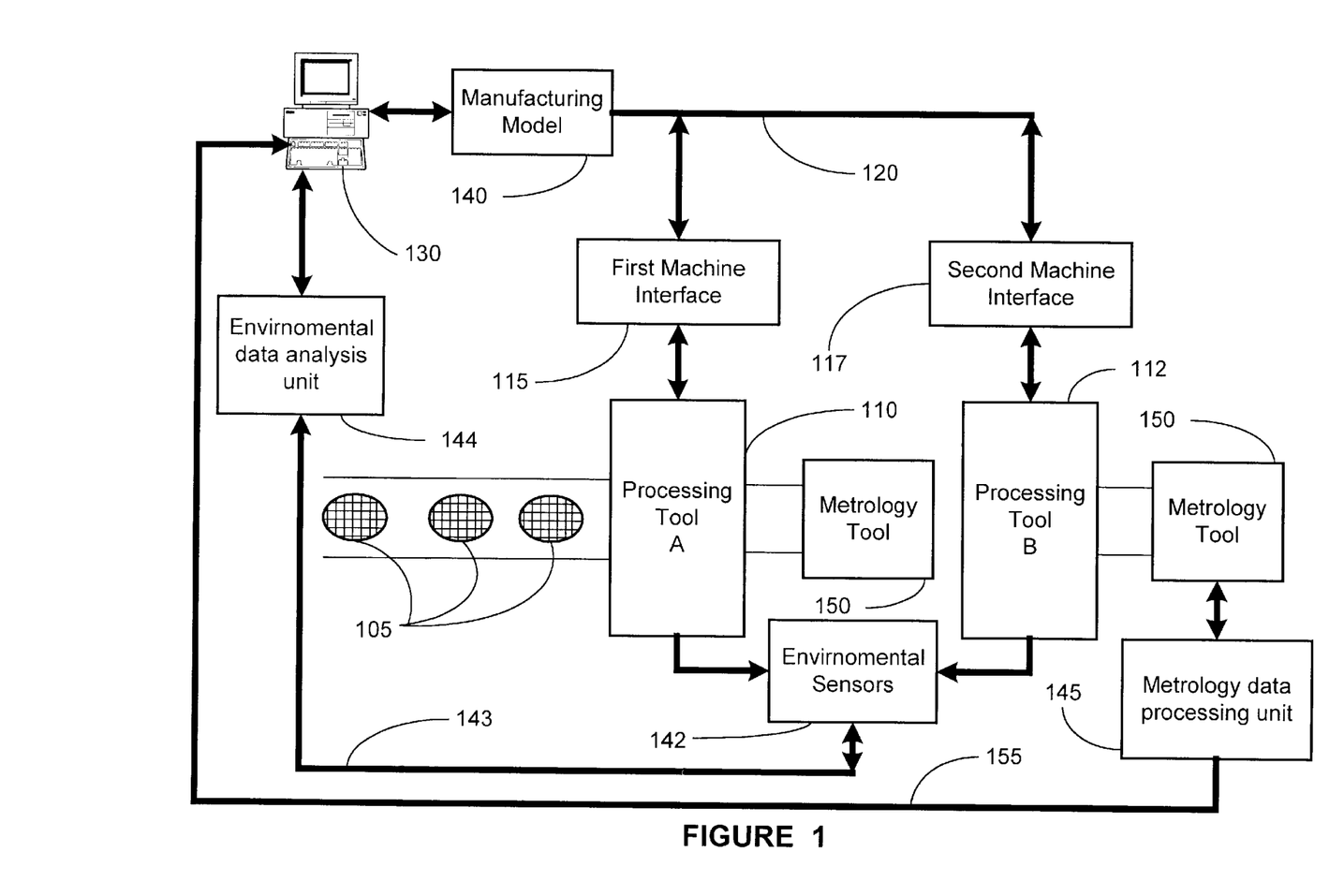
FIG. 1 illustrates one embodiment of the present invention.

Turning now to FIG. 1, one embodiment of the present invention is illustrated. In one embodiment, semiconductor products 105, such as semiconductor wafers, are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 contains a recipe that determines a plurality of control input parameters that are sent on the line 120.

In one embodiment, the manufacturing model 140 defines a process script and input control that implement a particular manufacturing process. The control input signals on a line 120 that are intended for processing tool A 110 are received and processed by the first machine interface 115. The control input signals on a line 120 that are intended for processing tool B 112 are received and processed by the second machine interface 117. Examples of the processing tools 110, 112 used in semiconductor manufacturing processes are steppers, scanners, step-and-scan tools, and etch process tools. In one embodiment, processing tool A 110 and processing tool B 112 are photolithography process tools, such as steppers.

The system illustrated in FIG. 1 includes environmental sensors 142 that acquire environmental data from processing tool A 110 and processing tool B 112. The environmental data that is collected includes barometric pressure during process operation, readings of certain gases present during process operation, ambient temperature conditions, and the relative humidity during process operation. In an alternative embodiment, data collection devices other than sensors, such as measurement devices, can be used to collect environmental data. Environmental data from the environmental sensors 142 is sent to the environmental data analysis unit 144 via a line 143. The environmental data analysis unit 144 organizes and correlates the environmental data from the environmental sensors 142 and sends the environmental data to the computer system 130, where it is stored. In one embodiment, the environmental data analysis unit 144 is a software program that is integrated into the computer system 130. The system illustrated in FIG. 1 is capable of processing semiconductor wafers, acquiring production data, such as environmental data, metrology data, and the like, and controlling the flow of semiconductor wafers during the manufacturing process.

Figure 2:
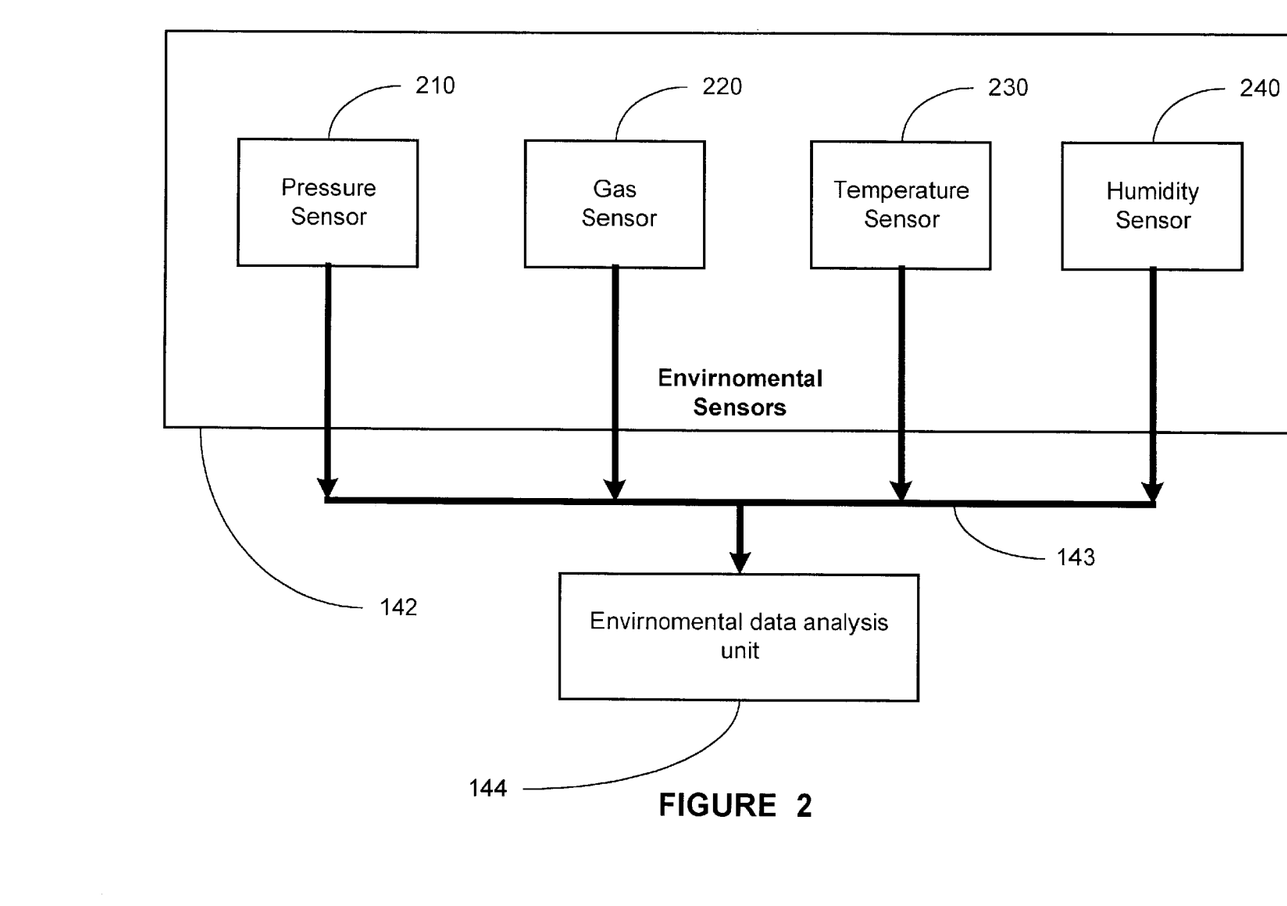
FIG. 2 illustrates a more detailed depiction of the environmental sensors described in FIG. 1.

Turning now to FIG. 2, one embodiment of the environmental sensors 142 is illustrated. The environmental sensors 142 may comprise at least one pressure sensor 210, at least one gas sensor 220, at least one temperature sensor 230, and at least one humidity sensor 240. As illustrated in FIG. 2, data from the individual sensors 210–240 is sent to the environmental data analysis unit 144 on the line 143. The pressure sensor 210 detects the barometric pressure during the operation of the processing tools 110, 112 and sends the pressure data to the environmental data analysis unit 144. The temperature and humidity sensors 230, 240 detect the ambient temperature and the relative humidity, respectively, during the operation of the processing tool 110, 112. The gas sensor 220 is capable of detecting nitrogen-bearing species, such as ammonium, and other process-related gases, during the operation of the processing tools 110, 112. The presence of nitrogen-bearing gases can cause non-uniform application of photoresist material on the semiconductor wafers, causing the deterioration of exposed portions of the semiconductor wafers. The environmental data analysis unit 144 collects and organizes the data, such as the amount of nitrogen-bearing species present, from the environmental sensors 142 and sends it to the computer system 130.

Turning back to FIG. 1, for processing tools such as steppers, the control inputs on the line 120 that are used to operate the processing tools 110, 112 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. For processing tools such as etch process tools, the control inputs on the line 120 include an etch time-period control signal, an etch temperature control signal, and an etch pressure control signal.

For photolithography processes, when a process step in a processing tool 110, 112 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112 on the semiconductor wafer. Modifications of the control inputs can be utilized to improve the performance of the process steps employed in the manufacturing tool. Many times, the errors that are found in the processed semiconductor products 105 can be correlated to a particular fault analysis and corrective actions can be taken to reduce the errors.

Figure 3:
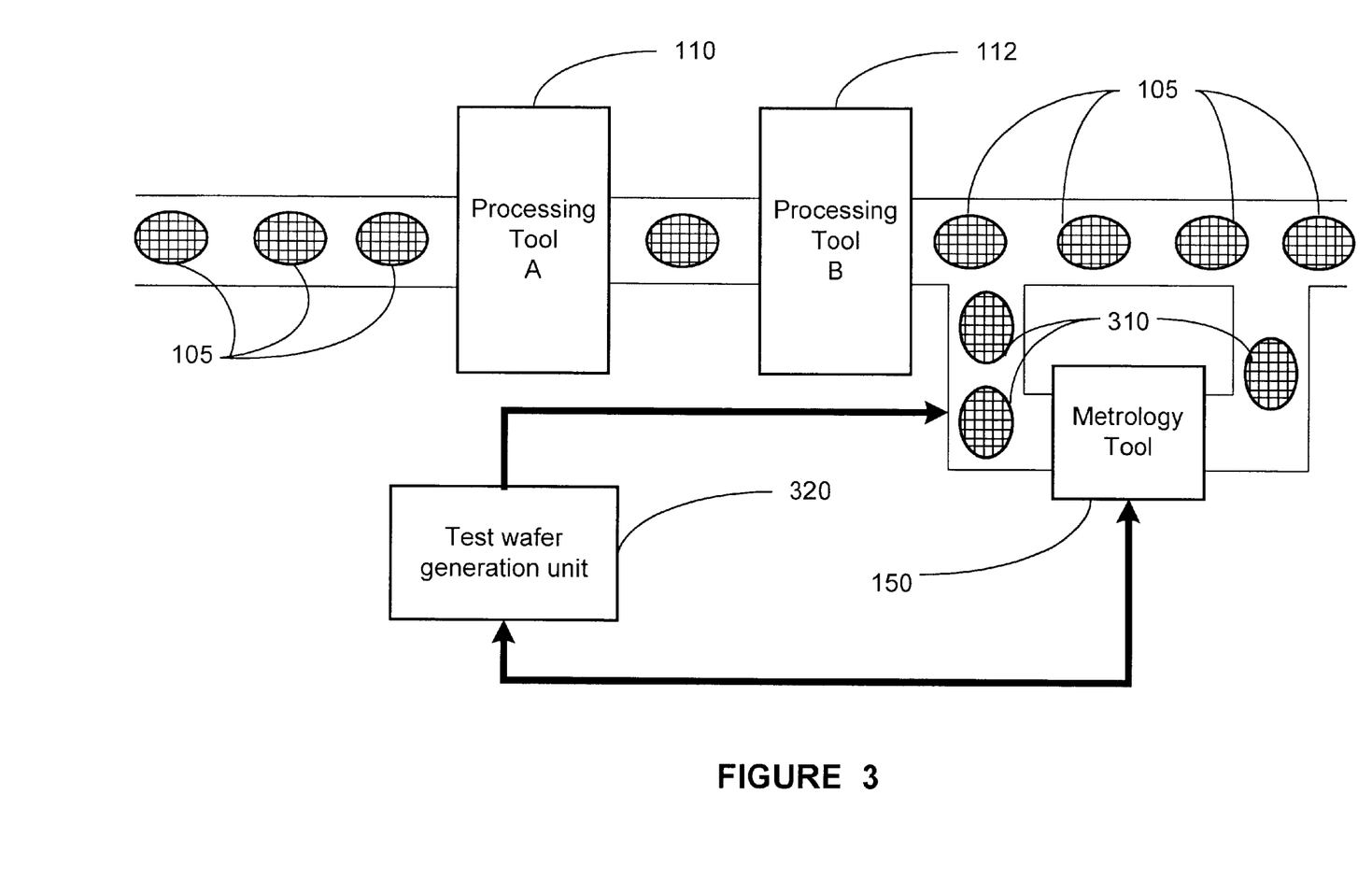
FIG. 3 illustrates one embodiment of a system for generating test semiconductor wafers as taught by the present invention.

Turning now to FIG. 3, one embodiment of a system for generating test semiconductor wafers is illustrated. Semiconductor products 105 are processed by processing tool A 110 and processing tool B 112. In one embodiment, the semiconductor products 105 are semiconductor wafers. Generally, semiconductor products 105 are processed by the processing tool A 110 and B 112 without metrology data acquisition being performed upon all of the processed semiconductor products 105. In one embodiment, a test wafer generation unit 320 automatically selects or acquires test wafers 310 for further analysis.

The test wafer generation unit 320 is integrated into the computer system 130, which in one embodiment, is integrated with the APC framework. In one embodiment, the test wafers 310 are a subset or a "child lot" from an original production lot of semiconductor products 105. The test wafer generation unit 320 selects test wafers 310 and sends them to the metrology tool 150 for metrology data acquisition. In one embodiment, the test wafers 310 are specialized semiconductor wafers that are designed to test the processing tools 110, 112. The test wafers 310 can be trial lot wafers or look-ahead wafers. In an alternative embodiment, the test wafers 310 are randomly selected semiconductor wafers that are being processed by the processing tools 110, 112.

Figure 4:
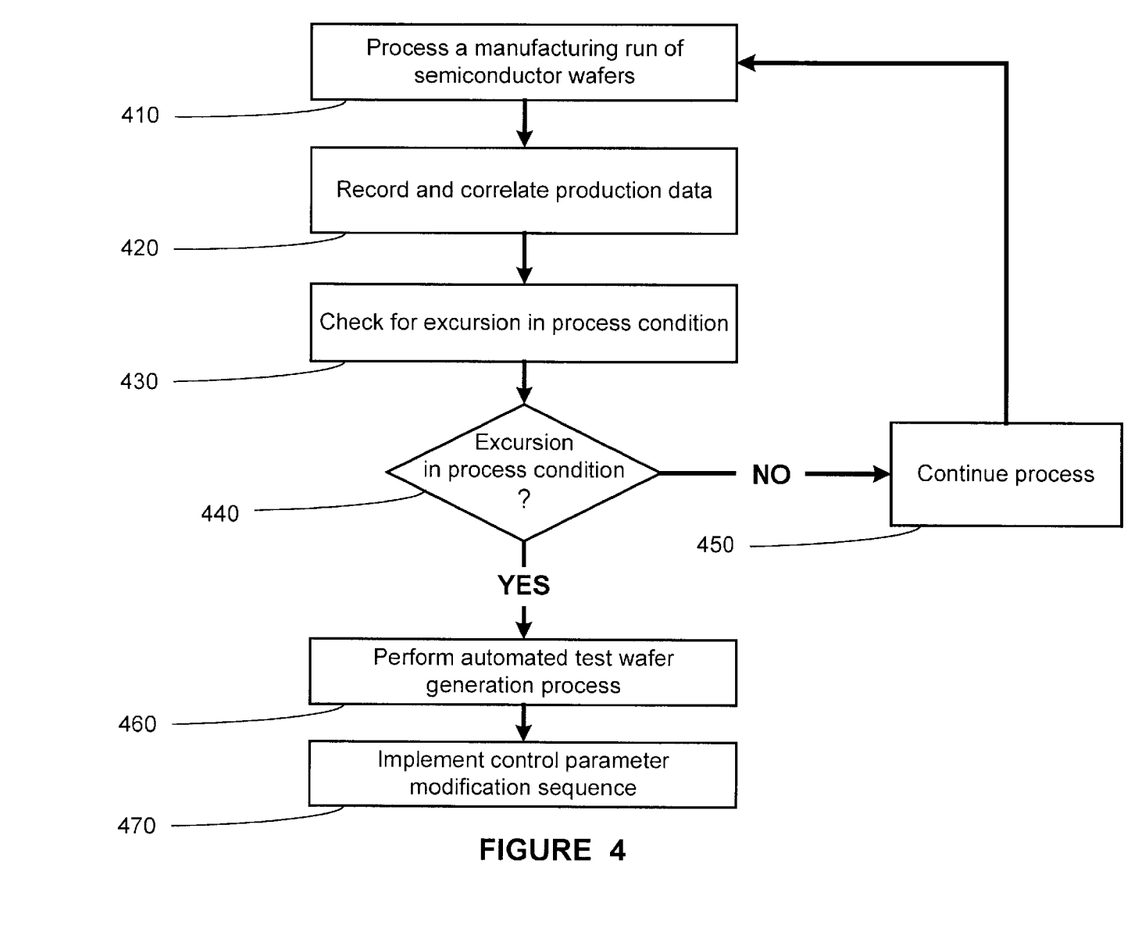
FIG. 4 illustrates one embodiment of a flowchart representation of the methods taught by the present invention.

Turning now to FIG. 4, one embodiment of a flowchart representation of the methods taught by the present invention is illustrated. A manufacturing lot of semiconductor wafers is processed by the processing tools 110, 112, as described in block 410 of FIG. 4. Production data from the processing of the semiconductor wafers are recorded and correlated with the particular lot of semiconductor wafers being processed, as described in block 420 of FIG. 4. In one embodiment, the production data is stored in memory (not shown) of the computer system 130. The production data comprises manufacturing data acquired by the machine interfaces 115, 117 and environmental data such as the relative pressure, the ambient temperature, the relative humidity, and the amount of stray gases present during the manufacturing process. The environmental data and the manufacturing data are correlated together with the appropriate manufacturing lot of semiconductor wafers. In one embodiment, the production data is correlated with the processed semiconductor wafers based upon a lot identification code, date code, and the like. The correlated data is stored in the computer system 130 for later retrieval.

Figure 5:
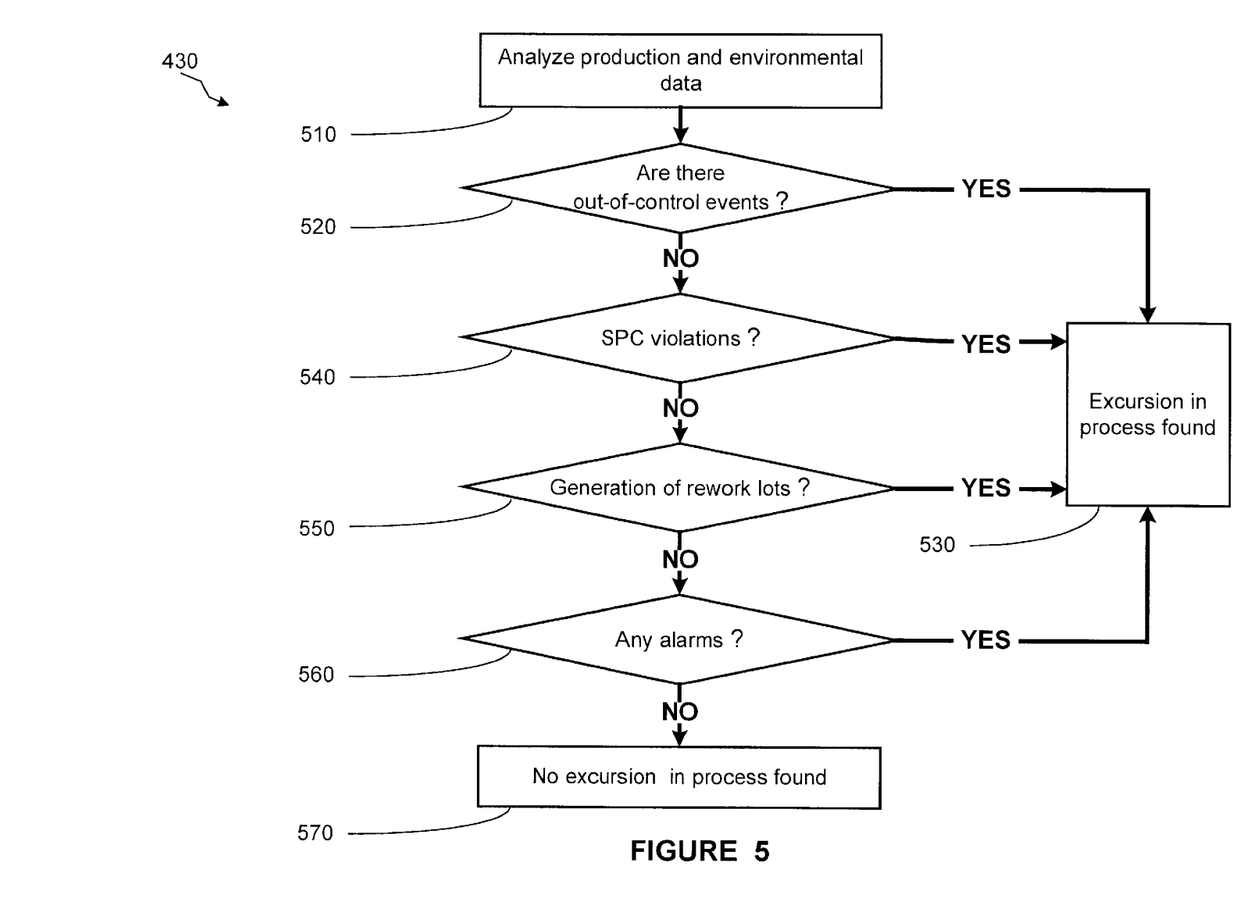
FIG. 5 illustrates a flowchart depiction of the process of examining process conditions relating to processing of semiconductor wafers.

Subsequently, conditions relating to the processing of semiconductor wafers are examined to check for excursions, or deviations, in the process conditions, as described in block 430 of FIG. 4. Examining the process conditions may comprise checking for manufacturing abnormalities, as understood by those skilled in the art, and examining production data. FIG. 5 illustrates a flowchart depiction of the process of examining the conditions relating to processing of the semiconductor wafers.

Turning now to FIG. 5, the production data, which includes the manufacturing data and the environmental data associated with a particular manufacturing lot of semiconductor wafers, is analyzed, as described in block 510. A determination is made whether there are out-of-control events during the manufacturing process of a particular semiconductor wafer, as described in block 520 of FIG. 5. Out-of-control events during a semiconductor wafer manufacturing process include process events, such as over-exposure during photolithography processes, over-etching during etch processes, and the like. When a determination is made that there are out-of-control events during a manufacturing process of a particular semiconductor wafer, a conclusion is made that some excursion in the process is found, as described in block 530 of FIG. 5.

When a determination is made that there are no significant out-of-control events during the manufacturing process of a particular semiconductor wafer, a check is made to determine whether any significant Statistical Process Control (SPC) violations occurred during the manufacturing process of semiconductor wafers, as described in block 540 of FIG. 5. In one embodiment, SPC is a method of monitoring, controlling, and, ideally, improving a process through statistical analysis. In one embodiment, SPC analysis is comprised of four main steps. The main steps of SPC analysis include measuring the process, reducing variances in the process to make the process more consistent, monitoring the process, and improving the process to produce its best value. In real-time SPC, which can be used for run-to-run control applications in one embodiment, data is collected from the most recently finished manufacturing run of semiconductor wafers before the next manufacturing run of semiconductor wafers is processed. Steps are taken to ensure that the quality of the processed semiconductor wafers is as consistent as possible from one manufacturing run to another. Generally, SPC analysis rules dictate that causes of errors discovered during one manufacturing run of semiconductor wafers must be corrected before the next manufacturing run of semiconductor wafers is performed.

When a determination is made that there is at least one significant SPC violation during the manufacturing process of semiconductor wafers, a determination is made that excursion in the process is present. When a determination is made that there are no significant SPC violations during the manufacturing process of semiconductor wafers, a determination is made whether there has been at least one manufacturing lot of semiconductor wafers that have been tagged for rework, as described in block 550. When at least one incident of a generation of a rework lot of semiconductor wafers has been identified, a determination is made that an excursion in the process is present.

When no incident of a generation of a rework lot of semiconductor wafers has been identified, a determination is made whether any manufacturing alarms were activated during the process, as described in block 560 of FIG. 5. Generally, manufacturing alarms are used to indicate that an unacceptable level in a manufacturing environmental factor is present. For example, an alarm will be activated when the relative pressure is excessively high during a process. Another alarm will be activated when the ambient temperature during a process is too high or too low. Likewise, another alarm will be activated when the relative humidity in the manufacturing area is too high during a process run of semiconductor wafers. In one embodiment, an alarm will be activated when there is an unacceptable level of nitrogen-bearing gases present during a process. When at least one activation of a manufacturing alarm during a process occurs, a determination is made that an excursion in the process is found. Conversely, when no activations of a manufacturing alarm during a process are detected, a determination is made that there are no excursions in the processing of semiconductor wafers.

Turning back to FIG. 4, and in particular referring to block 440, a determination is made whether there were any excursions in the process conditions during the processing of semiconductor wafers. When a determination is made that there were no significant excursions in the process conditions during the processing of semiconductor wafers, the processing of semiconductor wafers is continued, as described in block 450 of FIG. 4. When a determination is made that there was at least one significant excursion in the process conditions during the processing of semiconductor wafers, an automated test wafer generation process is performed, as described in block 460 of FIG. 4. A more detailed depiction of the steps used to perform the automated test wafer generation process is illustrated in FIG. 6.

Figure 6:
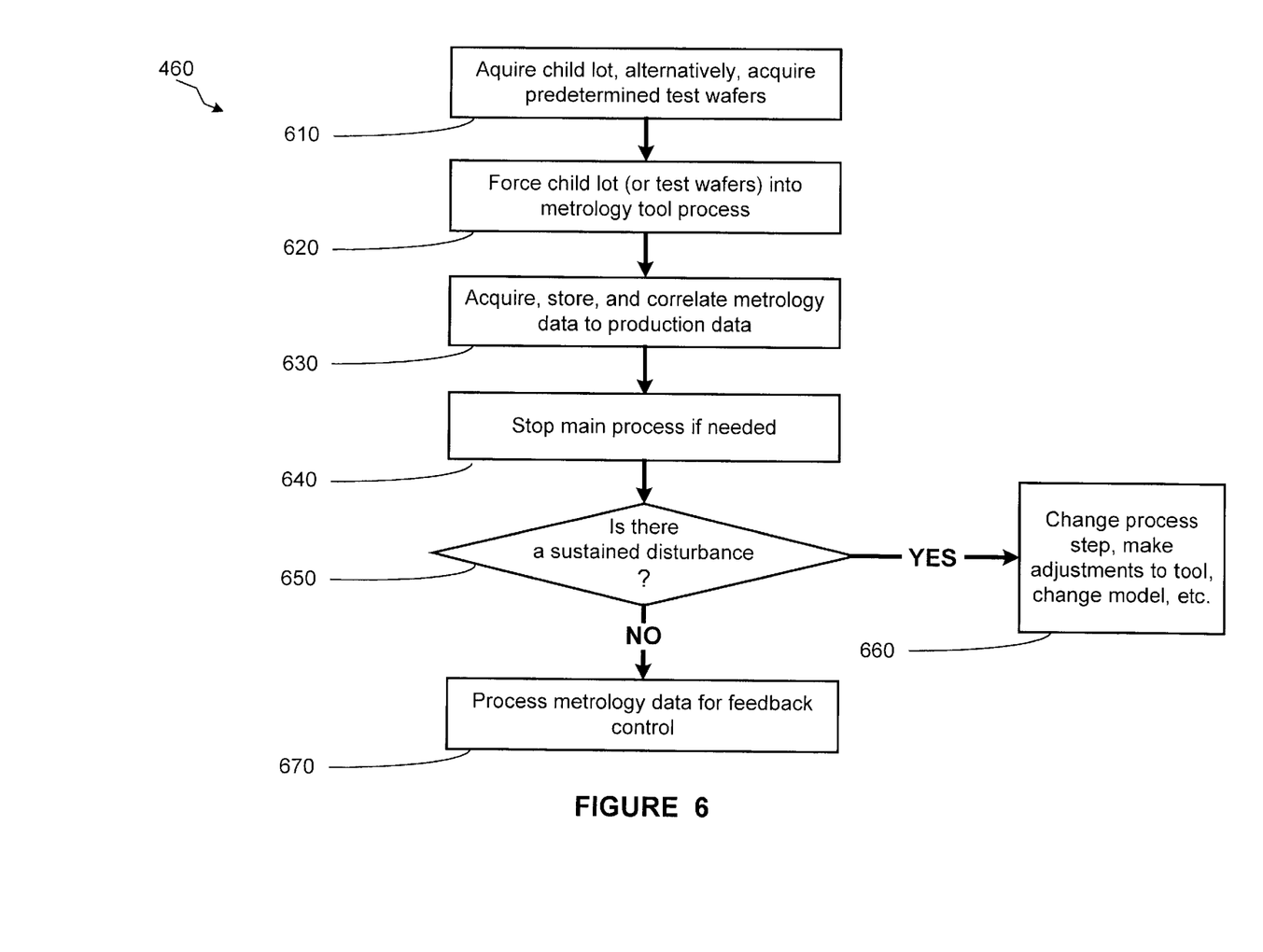
FIG. 6 illustrates a more detailed depiction of the steps used to perform the automated test wafer generation process as illustrated in FIG. 4.

Turning now to FIG. 6, a child lot that represents a set of test wafers 310 is acquired, as illustrated in block 610 of FIG. 6. Alternatively, a set of predetermined test wafers 310 that are generally scattered though a particular lot of semiconductor wafers are acquired. In one embodiment, once the test wafers 310 from a lot of semiconductor wafers are identified, one of a plurality of methods known by those skilled in the art is employed to move the test wafers 310 from the normal production line onto a test site.

When the test wafers 310 are acquired, they are sent to a metrology tool 150 for acquisition of metrology data, as described in block 620 of FIG. 6. Once the metrology data associated with the test wafers 310 is acquired, the metrology data is stored and correlated with the corresponding production data, as described in block 630 of FIG. 6. In one embodiment, the metrology data is processed by the metrology data processing unit 145 and stored into the memory of the computer system 130. Generally, the errors found on the test wafers 310 can be attributed to the remainder of the lot of semiconductor wafers. If the metrology data indicates that there are significant process errors, the main processing of the corresponding semiconductor wafers is suspended, as described in block 640 of FIG. 6.

A determination is then made whether the errors found in the test wafers 310 are due to an APC violation or whether the errors are part of a trend that is caused by a sustained disturbance in the process, as described in block 650 of FIG. 6. When the errors found in the test wafers 310 are caused by a simple disturbance in the process, a process feedback system in the APC framework would generally be capable of correcting the error. A sustained disturbance is generally more serious wherein the feedback system in the APC framework would correct the error in an acceptably long period of time. In some cases the feedback system in the APC framework may not be able to correct the error at all due to several reasons, including the fact that the data received by the APC framework may be incorrect.

When a determination is made that there is a sustained disturbance present, the process may be modified, adjustments to the processing tools 110, 112 may be made, modifications to the manufacturing model 140 may be performed, or other significant changes to the process system may be made, as described in block 660 of FIG. 6. The aforementioned changes to the system are made in order to reduce the effects to the sustained disturbance. When a determination is made that there are no significant sustained disturbances present, the acquired metrology data is processed and made ready to be used for feedback control, as described in block 670. The completion of the step described in block 670 completes the step of performing automated test wafer generation process described in block 460 of FIG. 4. Turning back to FIG. 4, once the step of performing automated test wafer generation process is substantially complete, a control parameter modification sequence is performed, as described in block 470 of FIG. 4. One embodiment of performing the control parameter modification sequence is illustrated in FIG. 7.

Figure 7:
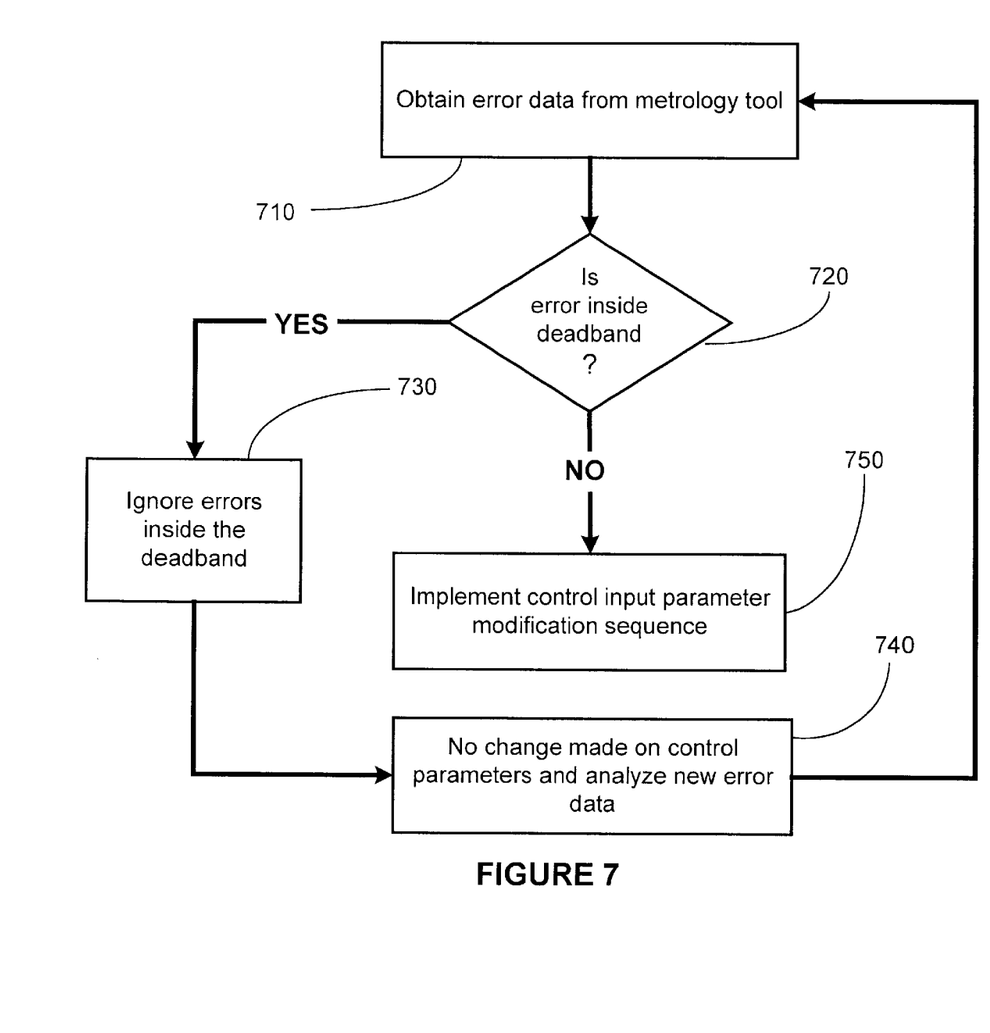
FIG. 7 illustrates one embodiment of performing a control parameter modification sequence described in FIG. 4.

Turning now to FIG. 7, error data from the metrology data related to processed semiconductor wafers is acquired, as described in block 710. Once the error data is acquired, a determination is made whether the error data is inside the deadband, as described in block 720 of FIG. 7. The step described in block 720 is performed to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input signals on the line 120, from causing a semiconductor manufacturing process to be inordinately jittery.

When a determination is made, as shown in block 720, that an error corresponding to a control input signal is inside the deadband, that particular error is ignored, as described in block 730 of FIG. 7. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data, as described in block 740 of FIG. 7. New error data is then obtained and analyzed, as described in block 740 of FIG. 7. In one embodiment, the steps described above are repeated for the new error data that is obtained.

When a determination is made, as shown in block 720, that an error corresponding to a control input signal is not inside the deadband, further processing, such as modifying the control input parameters to compensate for the errors, is performed, as described in block 750 of FIG. 7. The value of the error corresponding to a control input signal is used to update that control input parameter on the line 120 for a subsequent manufacturing process step, which completes the step of performing the control parameter modification sequence, described in block 470 of FIG. 4.

Figure 8:
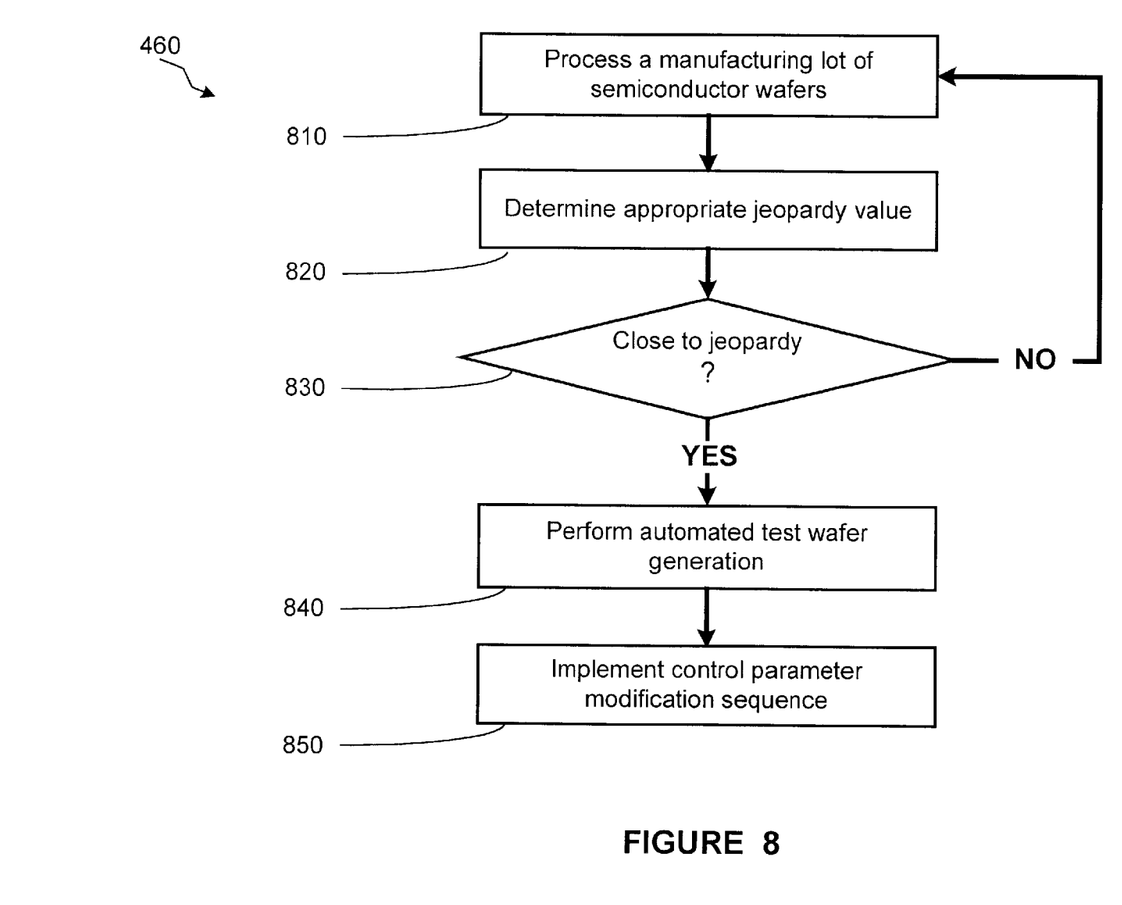
FIG. 8 illustrates an alternative embodiment of a flowchart representation of the methods taught by the present invention.

Turning now to FIG. 8, an alternative embodiment of the methods taught by the present invention is illustrated. A manufacturing lot of semiconductor wafers are processed, as described in block 810 of FIG. 8. An appropriate maximum jeopardy value for the manufacturing lot of semiconductor wafers is determined, as described in block 820 of FIG. 8. The maximum jeopardy value generally represents the amount of semiconductor wafers that can be processed without any one of the processed wafers being further tested for errors. For example, if ten lots of semiconductor wafers are processed without measuring them or acquiring metrology data, the jeopardy is equal to ten lots. Limits are generally placed upon the maximum jeopardy value before measurement of a lot and feedback is performed.

A determination is then made whether, during the processing of semiconductor wafers, the jeopardy is significantly close to the maximum jeopardy value, as described in block 830 of FIG. 8. When a determination is made that the jeopardy is not significantly close to the maximum jeopardy value, processing of the semiconductor wafers is continued. When a determination is made that the jeopardy is significantly close to the maximum jeopardy value, the automated test wafer generation process described in FIG. 6 is performed, as described in block 840 of FIG. 8. The automated test wafer generation process described in FIG. 6 is described above. When the automated test wafer generation process is concluded, a control parameter modification sequence is initiated, as described in block 850 of FIG. 8. The control parameter modification sequence described in block 850 is illustrated by the steps described in FIG. 7, which are described above.

The principles taught by the present invention can be implemented in an Advanced Process Control (APC) Framework. The APC is a preferred platform from which to implement the overlay control and etch process control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller and etch process controller. The control methods are generally defined and performed in these scripts. The development of these scripts can comprise a significant portion of the development of a control system.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

performing at least one process run of semiconductor devices;

determining whether an excursion of said process exists;

performing an automated test wafer generation process in response to said determination that an excursion of said process exists; and implementing a control parameter modification sequence for processing a subsequent run of semiconductor devices in response to an examination of said test wafers.

2. The method described in claim 1, wherein performing a process run of semiconductor devices further comprises processing semiconductor wafers.

3. The method described in claim 2, wherein processing semiconductor wafers further comprises performing a photolithography process on said semiconductor wafers.

4. The method described in claim 1, wherein determining whether an excursion of said process exists further comprises:

determining an appropriate maximum jeopardy value;

determining whether said maximum jeopardy value is sufficiently close; and determining that an excursion of said process exists in response to a determination that said maximum jeopardy value is sufficiently close.

5. The method described in claim 1, wherein determining whether an excursion of said process exists further comprises:

analyzing at least one of a production data and an environmental data;

determining whether there is an out-of-control event during said processing of semiconductor devices using said analysis of said production data;

determining whether there is a statistical probability control (SPC) violation using said analysis of said production data;

determining whether there is a generation of a rework lot during said processing of semiconductor wafers using said analysis of said production data;

determining whether there is an activation of an alarm during said processing of semiconductor wafers using said analysis of said production data; and determining that there is an excursion in a manufacturing process in response to a determination that there exists at least one of said out-of-control event, said SPC violation, said generation of rework lots, and said activation of an alarm.

6. The method described in claim 5, wherein acquiring environmental data further comprises acquiring at least one of:

a barometric pressure reading during a semiconductor manufacturing operation;

a nitrogen-bearing gas species reading;

an ambient temperature reading; and a relative humidity reading.

7. The method described in claim 1, wherein performing an automated test wafer generation process further comprises:

acquiring a child lot;

forcing said child lot into a metrology tool;

acquiring metrology data for said child lot;

determining whether there exists a sustained disturbance based upon said metrology data; and processing said metrology data.

8. The method described in claim 7, wherein acquiring metrology data further comprises acquiring at least one critical dimension measurement.

9. The method described in claim 1, wherein implementing a control parameter modification sequence further comprises:

acquiring error data from an analysis of metrology data;

determining if said error data is inside a deadband; and modifying at least one control input parameter based upon a determination that said error data is not inside said deadband.

10. A system, comprising:

a processing tool capable of performing a process on a first semiconductor wafer; and a controller operatively coupled to said processing tool, said controller being capable of determining whether an excursion of said process exists, performing an automated test wafer generation process in response to said determination that an excursion of said process exists, and modifying a control parameter for processing a second semiconductor wafer in response to an examination of said test wafers.

11. The system of claim 10, further comprising:

a computer system;

a manufacturing model coupled with said computer system, said manufacturing model being capable of generating at least one control input parameter signal;

a machine interface coupled with said manufacturing model, said machine interface being capable of receiving process recipes from said manufacturing model;

said processing tool capable of processing semiconductor wafers and coupled with said machine interface, said processing tool being capable of receiving at least one control input parameter signal from said machine interface;

a metrology tool coupled with said processing tool, said metrology tool being capable of acquiring metrology data;

a metrology data processing unit coupled with said metrology tool and said computer system, said metrology data processing unit being capable of organizing said acquired metrology data and sending said organized metrology data to said computer system;

an environmental sensor coupled to said processing tool, said environmental sensor being capable of acquiring environmental data during an operation of said processing tool;

an environmental data analysis unit coupled with said environmental sensor, said environmental data analysis unit being capable of organizing said environmental data and correlating said environmental data with said metrology data; and a test wafer unit coupled with said computer system, said test wafer unit being capable of acquiring test wafers in response to said environmental data analysis.

12. The system of claim 11, wherein said environmental sensor further comprises at least one of:

a pressure sensor;

a gas sensor;

a temperature sensor; and a humidity sensor.

13. The system of claim 11, wherein said computer system is capable of generating modification data for modifying at least one control input parameter.

14. The system of claim 13, wherein said manufacturing model is capable of modifying said control input parameter in response to said modification data.

15. The system of claim 11, wherein said metrology tool is capable of measuring at least one critical dimension on said processed semiconductor wafers.

16. An apparatus, comprising:

means for performing at least one process run of semiconductor devices;

means for determining whether an excursion of said process exists;

means for performing an automated test wafer generation process in response to said determination that an excursion of said process exists; and means for implementing a control parameter modification sequence for processing a subsequent run of semiconductor devices in response to an examination of said test wafers.

17. A computer readable program storage device encoded with instructions that, when executed by a computer, performs a method, comprising:

performing at least one process run of semiconductor devices;

determining whether an excursion of said process exists;

performing an automated test wafer generation process in response to said determination that an excursion of said process exists; and     implementing a control parameter modification sequence for processing a subsequent run of semiconductor devices in response to an examination of said test wafers.

18. The computer readable program storage device encoded with instructions that, when executed by a computer, performs the method described in claim 17, wherein performing a process run of semiconductor devices further comprises processing semiconductor wafers.

19. The computer readable program storage device encoded with instructions that, when executed by a computer, performs the method described in claim 18, wherein processing semiconductor wafers further comprises performing a photolithography process on said semiconductor wafers.

20. The computer readable program storage device encoded with instructions that, when executed by a computer, performs the method described in claim 17, wherein determining whether an excursion of said process exists further comprises:

determining an appropriate maximum jeopardy value;

determining whether said maximum jeopardy value is sufficiently close; and     determining that an excursion of said process exists in response to a determination that said maximum jeopardy value is sufficiently close.

21. The computer readable program storage device encoded with instructions that, when executed by a computer, performs the method described in claim 17, wherein determining whether an excursion of said process exists further comprises:

analyzing at least one of a production data and an environmental data;

determining whether there is an out-of-control event during said processing of semiconductor devices using said analysis of said production data;

determining whether there is a statistical probability control (SPC) violation using said analysis of said production data;

determining whether there is a generation of a rework lot during said processing of semiconductor wafers using said analysis of said production data;

determining whether there is an activation of an alarm during said processing of semiconductor wafers using said analysis of said production data; and     determining that there is an excursion in a manufacturing process in response to a determination that there exists at least one of said out-of-control event, said SPC violation, said generation of rework lots, and said activation of an alarm.

22. The computer readable program storage device encoded with instructions that, when executed by a computer, performs the method described in claim 21, wherein acquiring environmental data further comprises acquiring at least one of:

a barometric pressure reading during a semiconductor manufacturing operation;

a nitrogen-bearing gas species reading;

an ambient temperature reading; and a relative humidity reading.

23. The computer readable program storage device encoded with instructions that, when executed by a computer, performs the method described in claim 17, wherein performing an automated test wafer generation process further comprises:

acquiring a child lot;

forcing said child lot into a metrology tool;

acquiring metrology data for said child lot;

determining whether there exists a sustained disturbance based upon said metrology data; and     processing said metrology data.

24. The computer readable program storage device encoded with instructions that, when executed by a computer, performs the method described in claim 23, wherein acquiring metrology data further comprises acquiring at least one critical dimension measurement.

25. The computer readable program storage device encoded with instructions that, when executed by a computer, performs the method described in claim 17, wherein implementing a control parameter modification sequence further comprises:

acquiring error data from an analysis of correlation of metrology data and environmental data;

determining if said error data is inside a deadband; and     modifying at least one control input parameter based upon a determination that said error data is not inside said deadband.

\* \* \* \* \*